United States Patent
Valdes Garcia et al.

(10) Patent No.: US 11,824,272 B2
(45) Date of Patent: Nov. 21, 2023

(54) IN-FIELD MILLIMETER-WAVE PHASED ARRAY RADIATION PATTERN ESTIMATION AND VALIDATION

(71) Applicant: INTERNATIONAL BUSINESS MACHINES CORPORATION, Armonk, NY (US)

(72) Inventors: Alberto Valdes Garcia, Chappaqua, NY (US); Bodhisatwa Sadhu, Fishkill, NY (US); Yahya Mesgarpour Tousi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 287 days.

(21) Appl. No.: 17/319,029

(22) Filed: May 12, 2021

(65) Prior Publication Data

US 2021/0328343 A1 Oct. 21, 2021

Related U.S. Application Data

(62) Division of application No. 15/335,107, filed on Oct. 26, 2016, now abandoned.

(51) Int. Cl.
*H01Q 3/26* (2006.01)
*G01R 29/10* (2006.01)
(Continued)

(52) U.S. Cl.
CPC ............. *H01Q 3/267* (2013.01); *G01R 29/10* (2013.01); *G01S 19/485* (2020.05);
(Continued)

(58) Field of Classification Search
CPC ........ H01Q 3/267; G01R 29/10; H04B 14/12; H04B 14/21; H04B 1/1081; G01S 19/485
See application file for complete search history.

(56) References Cited

U.S. PATENT DOCUMENTS

| 4,359,740 A | 11/1982 | Frazita |
| 4,998,112 A | 3/1991 | Franchi et al. |
(Continued)

FOREIGN PATENT DOCUMENTS

| CN | 106332110 | 1/2017 |
| EP | 0 805 510 | 11/1997 |
(Continued)

OTHER PUBLICATIONS

Microwave. (1992). In C. G. Morris (Ed.), Academic Press Dictionary of Science and Technology (4th ed.). Elsevier Science & Technology. Credo Reference: https://search.credoreference.com/content/entry/apdst/microwave/0 (Year: 1992).*

(Continued)

*Primary Examiner* — Bernarr E Gregory
*Assistant Examiner* — Fred H Mull
(74) *Attorney, Agent, or Firm* — CHAU & ASSOCIATES, LLC

(57) ABSTRACT

An apparatus for calibrating a multi-antenna system includes an unmanned aerial vehicle (UAV). The UAV includes one or more millimeter-wave (mm-wave) single channel radios that can transmit and receive a mm-wave signal to or from a multi-antenna system under test; at least one directional antenna connected to the one or more radios; sensors that determine a position of the UAV; an omni-directional mobile or Wi-Fi transceiver that communicates with an operator; and a digital microprocessor unit connected to the one or more mm-wave single channel radios, the sensors, and the omni-directional mobile or Wi-Fi transceiver. The digital microprocessor unit can control motion of the UAV and analyze signals received from the one or more mm-wave single channel radios and the at least one directional antenna using position information received from the sensors.

10 Claims, 8 Drawing Sheets

(51) Int. Cl.
*H04B 1/10* (2006.01)
*H04B 17/12* (2015.01)
*G01S 19/48* (2010.01)
*H04B 17/21* (2015.01)
*H01Q 1/28* (2006.01)
*H04B 7/06* (2006.01)
*H04B 17/27* (2015.01)
*H04B 17/10* (2015.01)

(52) U.S. Cl.
CPC ............ *H04B 1/1081* (2013.01); *H04B 17/12* (2015.01); *H04B 17/21* (2015.01); *H01Q 1/28* (2013.01); *H04B 7/0617* (2013.01); *H04B 17/102* (2015.01); *H04B 17/27* (2015.01)

(56) References Cited

U.S. PATENT DOCUMENTS

| | | | |
|---|---|---|---|
| 5,396,255 | A | 3/1995 | Durkota |
| 5,565,873 | A | 10/1996 | Dean |
| 6,104,930 | A | 8/2000 | Ward et al. |
| 6,310,579 | B1 | 10/2001 | Meredith |
| 7,102,562 | B2 | 9/2006 | Moller et al. |
| 7,714,775 | B2 | 5/2010 | Navarro et al. |
| 8,457,569 | B2 | 6/2013 | Blin |
| 9,130,270 | B1 * | 9/2015 | Nelson ............... H01Q 3/267 |
| 2001/0027103 | A1 | 10/2001 | Willingham et al. |
| 2002/0090915 | A1 | 7/2002 | Komara et al. |
| 2006/0205342 | A1 | 9/2006 | McKay et al. |
| 2009/0153394 | A1 | 6/2009 | Navarro et al. |
| 2011/0267216 | A1 | 11/2011 | Smith |
| 2012/0086606 | A1 * | 4/2012 | Mathews ............... G01S 11/10 342/461 |
| 2013/0129026 | A1 * | 5/2013 | Petersen ............... G01S 19/13 375/371 |
| 2013/0154887 | A1 | 6/2013 | Hein et al. |
| 2013/0229310 | A1 | 9/2013 | Parks et al. |
| 2015/0073729 | A1 | 3/2015 | Borigo et al. |
| 2015/0341077 | A1 * | 11/2015 | Krasner ............... H04B 1/711 375/142 |
| 2016/0065288 | A1 | 3/2016 | Yu et al. |
| 2016/0088498 | A1 | 3/2016 | Sharawi |
| 2016/0269917 | A1 | 9/2016 | Hillegas, Jr. et al. |
| 2017/0092109 | A1 * | 3/2017 | Trundle ............. H04B 7/18504 |
| 2017/0324171 | A1 | 11/2017 | Shehan |
| 2018/0006706 | A1 | 1/2018 | Cheng et al. |
| 2018/0115065 | A1 | 4/2018 | Valdes Garcia et al. |
| 2018/0294850 | A1 | 10/2018 | Frenger et al. |
| 2019/0007128 | A1 | 1/2019 | Olson |
| 2019/0149276 | A1 | 5/2019 | Xiong et al. |
| 2019/0234786 | A1 | 8/2019 | Klicpera |

FOREIGN PATENT DOCUMENTS

| | | |
|---|---|---|
| EP | 2 615 450 | 7/2013 |
| GB | 2 256 948 | 12/1992 |
| JP | 5-302947 | 11/1993 |
| JP | 11027031 | 1/1999 |
| JP | 2010268044 A * | 11/2010 |
| WO | WO 2009/079174 | 6/2009 |
| WO | WO 2011/080742 | 7/2011 |

OTHER PUBLICATIONS

Millimeter wave. (1992). In C. G. Morris (Ed.), Academic Press Dictionary of Science and Technology (4th ed.). Oxford, UK: Elsevier Science & Technology. Retrieved from https://search.credoreference.com/content/entry/apdst/millimeter_wave/0 (Year: 1992).*

Radio frequency. (1992). In C. G. Morris (Ed.), Academic Press Dictionary of Science and Technology (4th ed.). Elsevier Science & Technology. Credo Reference: https://search.credoreference.com/content/entry/apdst/radio_frequency/0 (Year: 1992).*

Brendan Smith, et al.. "An Outdoor Scientific Data Drone Ground Truthing Test Site," 2015 International Conference On Unmanned Aircraft Systems (ICUAS) Jun. 9-12, 2015, pp. 436-443.

A. Ghosh, The 5G mmWAVE Radio Revolution Microwave Journal, p. 22-36, Sep. 2016 (Year: 2016).

Definition of Specification (2016) The American Heritage Dictionary of the English Language (6th Ed.) Houghton Mifflin, Credo Reference: https://search.credoreference.com/content/entry/hmdictenglang/specification (Year: 2016).

S. Sun et al., Synthesizing Omnidirectional Antenna Patterns, Received Power and Path Loss From Directional Antennas For 5 G Millimeter-Wave Communications, 2015 IEEE Global Communications Conference (Globecom), San Diego, p. 1-7, (Year: 2015).

A.M. Picar, Antenna Pattern Calibrating of Radio Telescopes Using an UAV-Based Device, 2015, International Conference On Electromagnectics in Advanced Applications (ICEAA), Sep. 2015 (Year: 2015).

* cited by examiner

IN-FIELD MILLIMETER-WAVE PHASED ARRAY RADIATION PATTERN ESTIMATION AND VALIDATION

CROSS REFERENCE TO RELATED APPLICATIONS

This application is a divisional of U.S. application Ser. No. 15/335,107, filed on Oct. 26, 2016 in the U.S. Patent and Trademark Office, the contents of which are herein incorporated by reference in their entirety.

BACKGROUND

Technical Field

Embodiments of the present disclosure are directed to estimating radiation patterns of multiple-antenna systems.

Discussion of the Related Art

The term "phased array" refers to an array of antennas in which the relative phases of the respective signals feeding the antennas are set in such a way that the effective radiation pattern of the array is reinforced in a desired direction and suppressed in undesired directions. Millimeter-wave, compact, base stations based on phased arrays for 5th generation (5G) wireless systems are expected to be deployed commercially around the world. For the first time, complex (>32 elements) millimeter-wave phased array antennas will need to be mass produced and deployed globally at a scale similar to that of Wi-Fi hotspots. However, the key characteristics of a phased array radiation pattern, such as the location of the main lobe and the side lobe intensity levels are challenging to estimate and calibrate.

During installation of a multi-antenna system, the calibration of the antenna array should be performed on-site. For line of sight (LoS) signaling, optimizing the active beamforming base-station for LoS communication in a given environment is critical. However, channel measurements for optimization need to be performed in the field. The calibration should be automated and require little expertise from installation engineers. A fast and inexpensive method calibration is needed to support mass production and installation of phased arrays for either radar or communication applications.

SUMMARY

According to an embodiment of the disclosure, there is provided an apparatus for calibrating a multi-antenna system that includes an unmanned aerial vehicle (UAV). The UAV includes one or more millimeter-wave (mm-wave) single channel radios that can transmit and receive a mm-wave signal to or from a multi-antenna system under test, at least one directional antenna connected to the one or more radios, sensors that determine a position of the UAV, an omnidirectional mobile or Wi-Fi transceiver that communicates with an operator, and a digital microprocessor unit connected to the one or more mm-wave single channel radios, the sensors, and the omni-directional mobile or Wi-Fi transceiver, said digital microprocessor unit configured to control motion of the UAV and to analyze signals received from the one or more mm-wave single channel radios and the at least one directional antenna using position information received from the sensors.

According to a further embodiment of the disclosure, the at least one directional antenna is a circularly polarized antenna.

According to a further embodiment of the disclosure, the at least one directional antenna includes two single-polarized antennas.

According to a further embodiment of the disclosure, the UAV determines its position with respect to the base station, performs measurements for a given beam direction with respect to the base station of a beam received from the base station, for a finite number of locations with a known distance/angle with respect to the base station, compares the measurements against a predetermined radiation pattern to determine any potential anomalies, and adjusts a phase and amplitude of individual elements of the phased array to correct for any measured anomalies.

According to a further embodiment of the disclosure, the UAV determines its position with respect to the base station, transmits a beam to the base station, and the base station performs measurements for a given beam direction with respect to the UAV, for a finite number of locations with a known distance/angle with respect to the UAV, compares the measurements against a predetermined radiation pattern to determine any potential anomalies, and adjusts a phase and amplitude of individual elements of the phased array to correct for any anomalies detected by the UAV.

According to a further embodiment of the disclosure, the sensors that determine a position of the UAV include a GPS receiver and a camera.

According to another embodiment of the disclosure, there is provided a method of calibrating a phased array base station using an unmanned aerial vehicle (UAV), including determining a position of the UAV with respect to the base station, performing measurements by the UAV for a given beam direction with respect to the base station for a beam emitted by the base station, for a finite number of locations of the UAV with a known distance/angle with respect to the base station, estimating the radiation pattern emitted by the base station for each given UAV location based on the measurement, comparing the estimated radiation pattern against a predetermined radiation pattern to determine any potential anomalies, and adjusting a phase and amplitude of individual elements of the phased array to correct for any measured anomalies.

According to a further embodiment of the disclosure, the method includes identifying directions for which the phased array does not emit a valid pattern and cannot be corrected.

According to a further embodiment of the disclosure, the method includes repeating the steps of determining a position of the UAV, performing measurements by the UAV for a given beam direction, estimating the radiation pattern, and comparing the estimated radiation pattern against a predetermined radiation pattern for as many beam directions as is needed.

According to another embodiment of the disclosure, there is provided a method of calibrating a phased array base station using an unmanned aerial vehicle (UAV), including determining a position of the UAV with respect to the base station, performing measurements by the base station for a given beam direction emitted by the UAV with respect to the base station, for a finite number of locations of the UAV with a known distance/angle with respect to the base station, estimating the radiation pattern emitted by the UAV for each given UAV location based on the measurement, comparing the estimated radiation pattern against a predetermined radiation pattern to determine any potential anomalies, and adjusting a phase and amplitude of individual elements of the phased array to correct for any measured anomalies.

According to another embodiment of the disclosure, there is provided an apparatus for calibrating a multi-antenna system that includes an unmanned aerial vehicle (UAV). The UAV includes one or more micro-wave single channel radios that can transmit and receive a micro-wave signal to or from a multi-antenna system under test, a MIMO antenna, a plurality of sensors, and a digital microprocessor unit connected to the sensors and one or more radios. The digital microprocessor unit can control motion of the UAV and analyze signals received from or transmitted by the MIMO antenna using position information received from the sensors.

According to a further embodiment of the disclosure, the MIMO antenna is one of an omni or a directional antenna.

According to a further embodiment of the disclosure, the sensors include a gyroscope, an accelerometer, an altimeter, a GPS receiver and a camera.

According to a further embodiment of the disclosure, the UAV includes multiple antennas with switched beam/phased array functionality at the frequency being analyzed.

According to a further embodiment of the disclosure, the UAV moves in three orthogonal directions at one or more speeds, transmits a single tone at a frequency of interest to a MIMO base station or receives and records over time a single tone at a frequency of interest transmitted by the MIMO base station, analyzes the signals using a Fourier Transform, and identifies Doppler shifts in the analyzed signals, wherein a multi-path component in a direction of motion has a largest Doppler shift, and components orthogonal to the direction of motion have the least Doppler shift.

According to another embodiment of the disclosure, there is provided a method of calibrating a MIMO system using an unmanned aerial vehicle (UAV), including moving the UAV in three orthogonal directions at one or more speeds, receiving and recording by a MIMO base station over time a single tone at a frequency of interest transmitted by the UAV, analyzing the received signal using a Fourier Transform, and identifying Doppler shifts in the analyzed signals, wherein a multi-path component in a direction of motion has a largest Doppler shift, and components orthogonal to the direction of motion have the least Doppler shift.

According to a further embodiment of the disclosure, the method includes obtaining additional data by pointing a transmitter antenna of the UAV in different directions using a combination of rotation and multiple switched/phased array antenna, and using the additional data to improve resolution of a model of the multi-path components.

According to another embodiment of the disclosure, there is provided a method of calibrating a MIMO system using an unmanned serial vehicle (UAV), including moving the UAV in three orthogonal directions at one or more speeds, receiving and recording by the UAV over time a single tone at a frequency of interest transmitted by the MIMO system, analyzing the received signal using a Fourier Transform, and identifying Doppler shifts in the analyzed signals, wherein a multi-path component in a direction of motion has a largest Doppler shift, and components orthogonal to the direction of motion have the least Doppler shift.

According to a further embodiment of the disclosure, the method includes obtaining additional data by pointing a receiver antenna of the UAV in different directions using a combination of rotation and multiple switched/phased array antenna, and using the additional data to improve resolution of a model of the multi-path components.

DETAILED DESCRIPTION OF EXEMPLARY EMBODIMENTS

Figure 1:
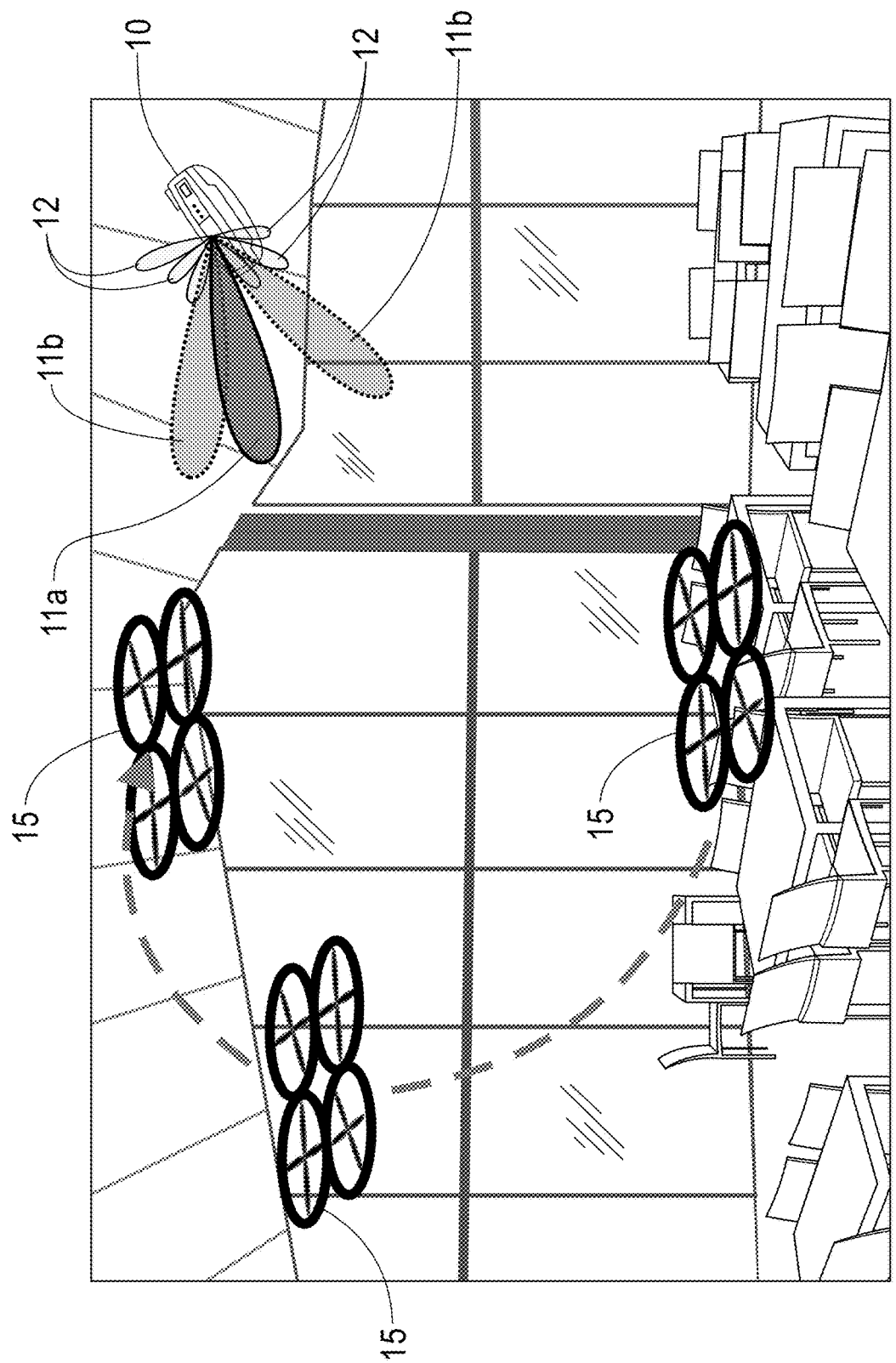
FIG. 1 illustrates an exemplary base station and unmanned aerial vehicle (UAV)/drone, according to an embodiment of the disclosure.

Exemplary embodiments of the disclosure as described herein generally include systems and methods for in-field calibration of multiple antenna systems. Accordingly, while the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure. In addition, it is understood in advance that embodiments of the present invention are capable of being implemented in conjunction with any other type of computing environment now known or later developed.

According to embodiments of the disclosure, a base-station having a phased array is installed at a desired location, and a drone/robot with one or more sensors for measuring the beam pattern is used to estimate array pattern characteristics at different angles and distances with respect to the base-station. The gain and phase coefficients can then be optimized for each given channel in a desired location, after which directions based on on-field calibration measurements can be discarded.

FIG. 1 illustrates an exemplary multiple-antenna base station 10 and an unmanned aerial vehicle (UAV)/drone 15, according to an embodiment. Referring to the figure, the lobes 11a, 11b projecting from the base station are the main beam lobes, and the lobes 12 are the side-lobes. The solid-line-enclosed lobe 11a denotes a current pointing direction while the dotted-line-enclosed lobes 11b indicate other directions in which the base-station can point. Note that the figure shows multiple possible positions of a single UAV 15.

Figure 2:
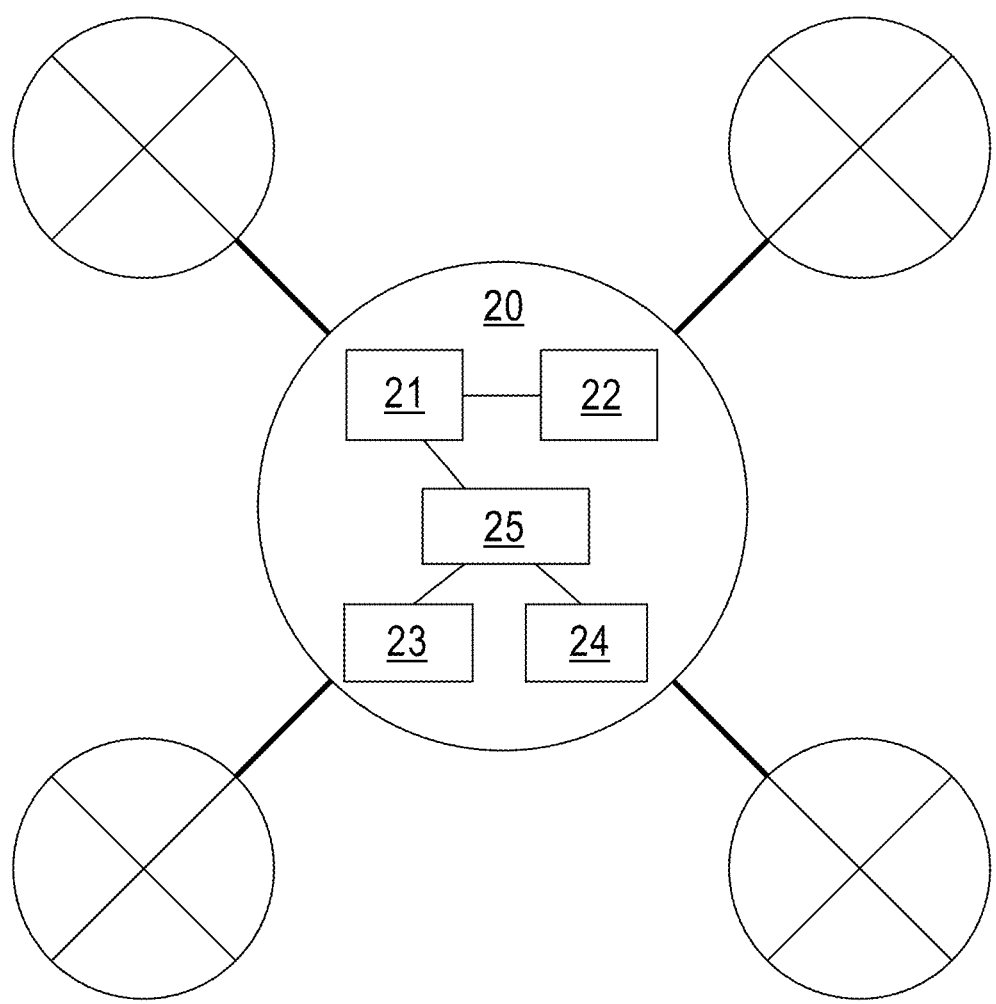
FIG. 2 is a schematic block diagram of an exemplary calibration drone according to embodiment of the disclosure.

FIG. 2 is a schematic block diagram of an exemplary calibration drone according to embodiment. Referring to the figure, a calibration UAV/drone 20 includes one or more millimeter-wave (mmWave) single channel radios 21 that can receive or transmit a mm wave signal from the base station, one or more antennas 22 connected to the radios 21, sensors 23 to aid in position identification, and an omnidirectional mobile or Wi-Fi transceiver 24, such as a 4G receiver, that can communicate with an operator and the base station, and a digital microprocessor unit 25 to which components 21, 23 and 24 are connected. To validate/calibrate the transmit-mode pattern of the phased array antenna, the radio 21 in the drone should be in a receive mode, and to calibrate the receive-mode pattern of the phased array antenna, the radio 21 in the drone should be in a transmit mode. Exemplary, non-limiting sensors 23 for identifying the drone position with respect to the base station are a GPS receiver and a camera, however, other sensors as are known to those of ordinary skill in the art may also be used in other embodiments of the disclosure. Exemplary, non-limiting examples of other position sensing systems include Bluetooth-based positioning using received signal strength indicator (RSS) information and trilateration, and Wi-Fi-based positioning using time of arrival (ToA) information and trilateration. Non-limiting examples of the antenna 22 include a circularly polarized horn antenna or two single-polarized horn antennas, one for each polarization. Note that when two single-polarized horn antennas are used, a drone according to an embodiment can calibrate a dual-polarized based station with better accuracy. Horn antennas can provide sharp beam or field of view, however, according to embodiments, it is not necessary to employ this specific type of antenna as similar radiation patterns can be detected/obtained with other designs with different size/cost trade-offs. Note that unlike drones, conventional base stations incorporate a receiver and a processor to receive/process incoming signals and pass them to a network. These components can be re-used/re-programmed for the purposes of calibration.

According to embodiments, the drone can be either an automated vehicle with built it navigation or can be controlled by an operator/technician through software on a laptop. It is desired for the drone to automatically scan the environment and collect the data and then send the data to a user laptop for further processing.

A phased array antenna according to an embodiment features both transmit (TX) and receive (RX) mode beam patterns which can be different and may have different calibration coefficients. To calibrate the phased array antenna's TX mode radiation pattern, the phased array antenna should be set in TX mode and the drone acts as a receiver to measure the signal amplitude that it receives at each position. To calibrate the phased array antenna's RX mode pattern, the phased array antenna should be set in RX mode and then the drone acts as a transmitter, in which case the phased array antenna measures the amplitude of the signal transmitted by the drone from different positions.

Figure 3A:
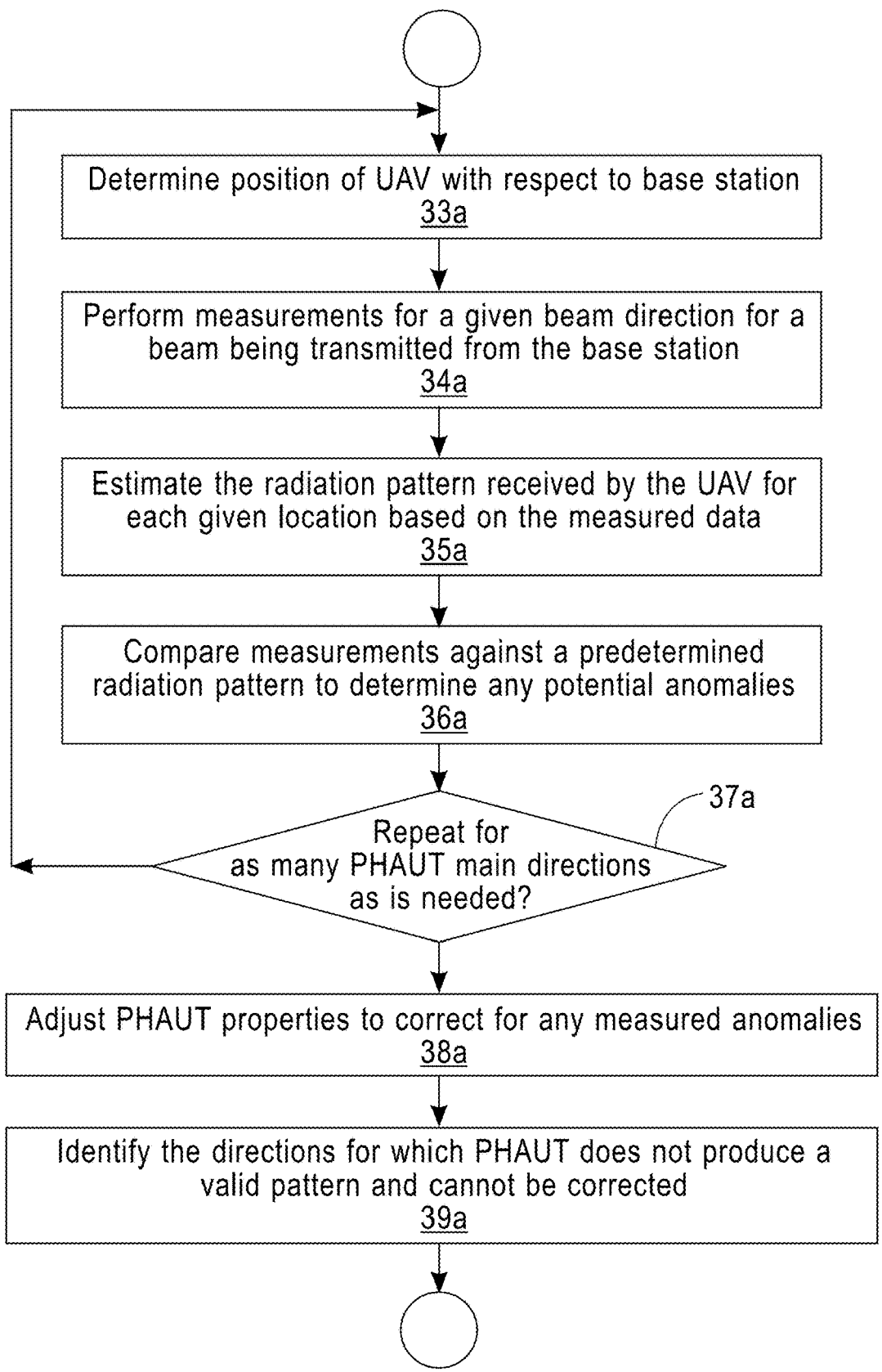
FIGS. 3A and 3B are flow charts of methods of calibrating a phased array base station according to embodiments of the disclosure.

A method of calibrating a phased array base station in TX mode according to an embodiment is illustrated in the flow chart of FIG. 3A. However, before the phased array base station is calibrated, a simulation algorithm for the phased array being calibrated is developed, which is then used to model the radiation pattern across the entire space. Referring now to the flowchart, a method according to an embodiment begins at step 33a, by determining the position of UAV with respect to base station using the GPS receiver and camera, and other known methods. Enhanced accuracy can be obtained using the mmWave signal itself. At step 34a, for a given beam direction of a beam being transmitted from the base station, measurements are performed for a finite number of locations of the UAV with a known distance/angle with respect to the phased array antenna under test. At this time, known side lobes can be tested. Then, at step 35a, the radiation pattern received by the UAV for each given location can be estimated based on the measured data. The estimated radiation pattern can then be compared at step 36a against the predetermined model radiation pattern to determine any potential anomalies. Steps 33a to 36a can be performed for as many phased array antenna main directions as is needed from step 37a. At step 38a, phased array antenna properties, such as the phase and amplitude of individual elements in the phased array antenna, can be adjusted to correct for any measured anomalies. The adjustment can tune the radiation pattern to cover potential blind spots that occur due to multipath fading in the environment. At step 39a, the directions for which phased array antenna does not produce a valid pattern and cannot be corrected are identified.

Figure 3B:
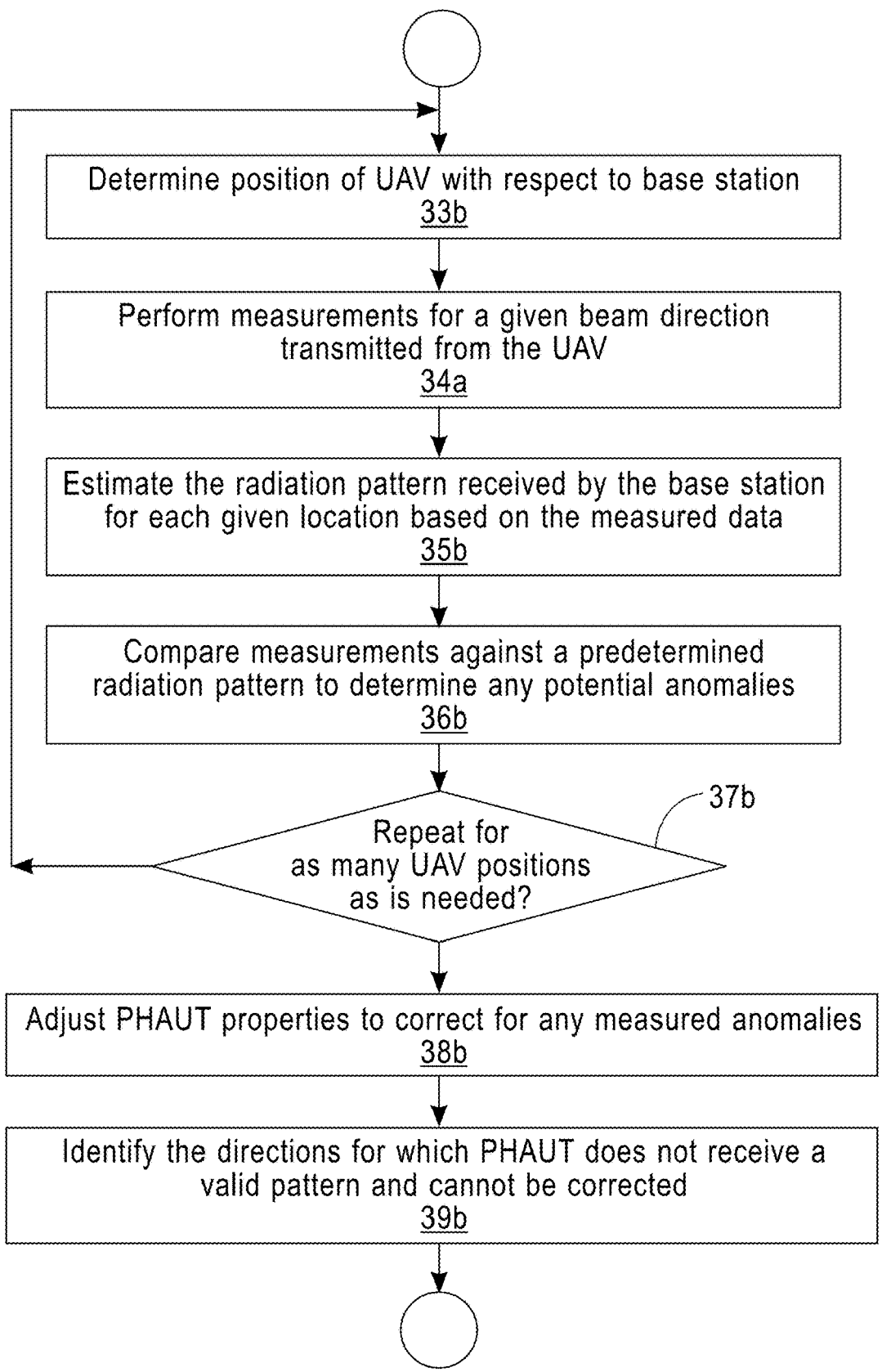

A method of calibrating a phased array base station in RX mode according to an embodiment is illustrated in the flow chart of FIG. 3B. Referring now to the flowchart, a method according to an embodiment begins at step 33b, by determining the position of UAV with respect to base station using the GPS receiver and camera, and other known methods, including the mmWave signal itself as described above. At step 34b, for a given receiver beam direction, measurements are performed by the base station with respect to the UAV for a finite number of UAV locations with a known distance/angle with respect to the phased array antenna under test (PHAUT). Then, at step 35b, the receiver radiation pattern formed by the base station can be estimated based on the measured data. The estimated receiver radiation pattern can then be compared at step 36b against the predetermined pattern to determine any potential anomalies. Steps 33b to 36b can be performed for as many UAV positions as is needed from step 37a. At step 38a, phased array antenna properties, such as the phase and amplitude of individual elements in the phased array antenna, can be adjusted by the base station to correct for any measured anomalies. The adjustment can tune the antenna to cover potential blind spots that occur due to multipath fading in the environment. At step 39a, the directions for which phased array antenna does not receive a valid pattern and cannot be corrected are identified.

Figure 4:
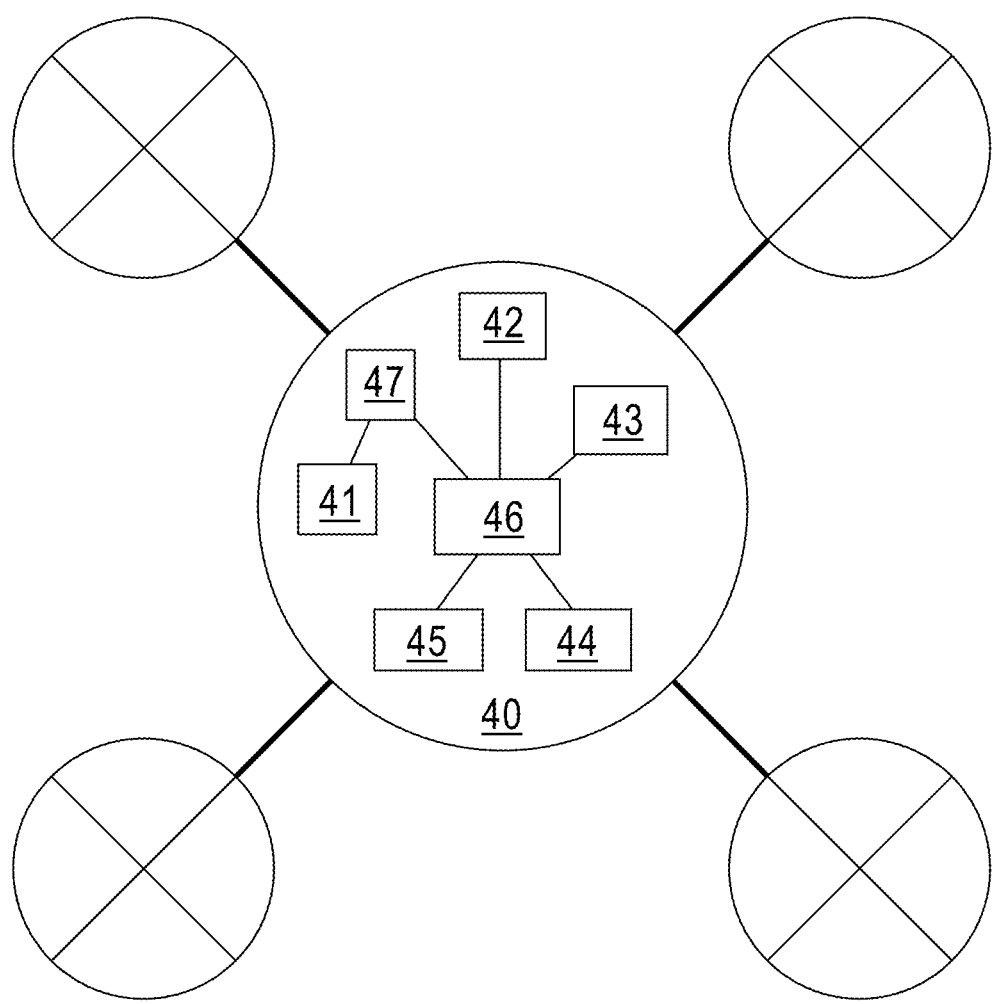
FIG. 4 is a schematic block diagram of an exemplary multiple-input and multiple-output (MIMO) calibration UAV according to embodiment of the disclosure

Embodiments of the disclosure can also be applied to MIMO systems, which typically, but not exclusively, operate at microwave frequencies. Note that a phased array according to an embodiment can be considered to be a special case of a MIMO system. Microwave transmission differs from mm-wave transmission in that microwave transmission normally involves many reflections and, as a result, multi paths are common. On the other hand, for mm-wave frequencies, reflected signals are normally much weaker than the line of sight and as a result the main signal is the line of sight transmission. In terms of implementation this means that microwave systems need extra effort to estimate and compensate degrading effects such as multi-path fading of the signal. FIG. 4 is a schematic block diagram of an exemplary microwave calibration UAV according to embodiment. Referring to the figure, a UAV 40 for a microwave system includes one or more microwave single channel radios 47 that can receive or transmit a microwave signal from the base station, an omni or directional antenna 41 connected to the radios 47, sensors 42, 43 for sensing motion of the drone as it detects the MIMO signal, a camera 44, and a GPS receiver 45, and a digital microprocessor unit 46 connected to the sensors 42, 43, camera 44, GPS receiver 45, and radio(s) 47. In some embodiments, the UAV includes multiple antennas with switched beam/phased array functionality at the frequency being analyzed. Exemplary, non-limiting sensors for determining the drone motion and position with respect to the base station include a gyroscope and accelerometer 42, and an altimeter 43.

A MIMO antenna according to an embodiment features both transmit (TX) and receive (RX) mode beam patterns which can be different and may have different calibration coefficients. MIMO calibration can estimate the channel, or more specifically, its multi-path components, between the access point and a certain location, such as a drone's position. For this purpose it should be sufficient to make a channel estimation/measurement only in one direction, which would be at an access point in TX mode and at the drone's position in RX mode. However, the channel may not be 100% reciprocal if the measurement point has different TX-mode and RX-mode air interface characteristics, for example, if there are different numbers of TX and RX antennas. To calibrate the MIMO antenna's TX mode radiation pattern, the MIMO antenna should be set in TX mode and the drone acts as a receiver to measure the signal amplitude that it receives at each position. To calibrate the MIMO antenna's RX mode pattern, the MIMO antenna should be set in RX mode and then the drone acts as a transmitter, in which case the MIMO antenna measures the amplitude of the signal transmitted by the drone from different positions.

Figure 5A:
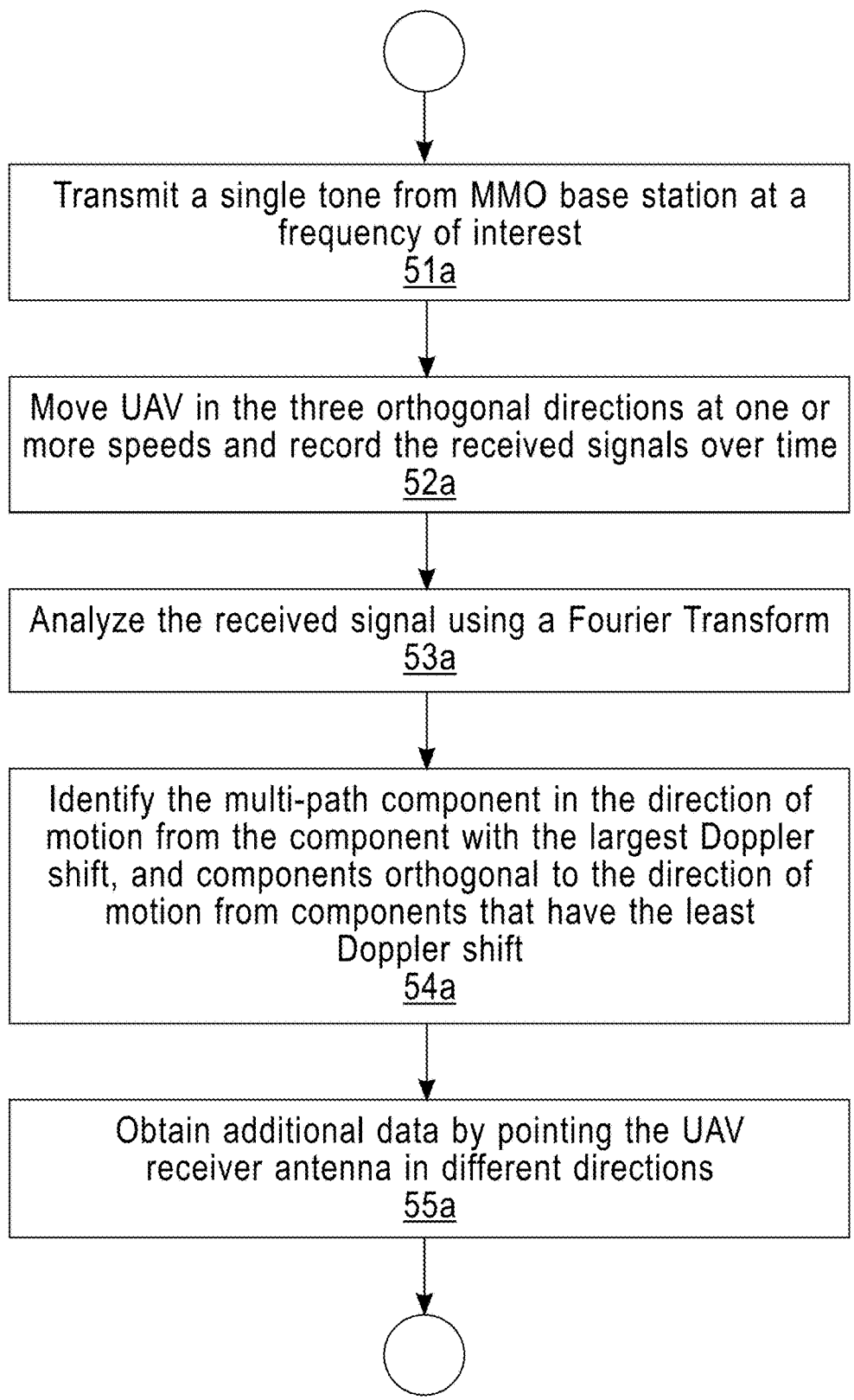
FIGS. 5A and 5B are flow charts of methods of calibrating a multiple-input and multiple-output (MIMO) transceiver according to embodiments of the disclosure.

A method of calibrating a MIMO transmitter according to an embodiment is illustrated in the flow chart of FIG. 5A. The signal pattern is calibrated using the feedback provided by the drone. Having a simple model of the reflections would be helpful in the optimization algorithm but in general it is not necessary, because the drone provides continuous information about the channel and the multiple antennas can repetitively adjust its coefficients to achieve the optimal pattern. The corrections are made by adjusting the phase and amplitude of individual elements in the phased array. Referring now to the flow chart, a method according to an embodiment begins at step 51a, by having the MIMO base station transmitter under test transmit a single tone at the frequency of interest. The UAV makes short quick movements in the three orthogonal directions and one or more speeds and records the received signals over time, at step 52a. At step 53a, the received signal is analyzed using a Fourier Transform for the different frequency components. In microwave frequencies where there are multiple paths, the Fourier transform of the signal is used to detect changes in frequency as a result of UAV movements. These movements result in Doppler shifts of the frequency which provide information about the direction of individual signal paths and can be used to further estimate and compensate the channel. The Doppler shifts can be used to distinguish between multiple overlaying signals coming from different paths. By using Fourier analysis to understand the Doppler effect, the different paths of the signal can be estimated and as a result the properties of the communication channel can be estimated for calibration. Thus, at step 54a, the multi-path component in the direction of motion is identified from the component with the largest Doppler shift, while components orthogonal to the direction of motion are identified from components that have the least Doppler shift. Additional data can be obtained at step 55a by pointing the UAV receiver antenna in different directions using a combination of rotation and multiple switched/phased array antennas, if available. In the case of multiple switched antennas, there can be multiple antennas pointing in different directions, and a switch can choose which antenna to use. In this case, accurate rotation is not necessary. Instead, the UAV can remain steady while the antennas are switched in and out. In some embodiment, electronic switching is expected to be faster than UAV rotation, and offers an advantage. In the case of phased array antennas, multiple antennas can be used to create a pointed beam by aligning their phases. The beam direction can be changed by changing the phase of the signal at each of the antennas. This is potentially the quickest technique for pointing the antenna. According to embodiments, the additional data can be used to improve resolution to achieve a fine-grained model of the multipath components at each spatial location.

Figure 5B:
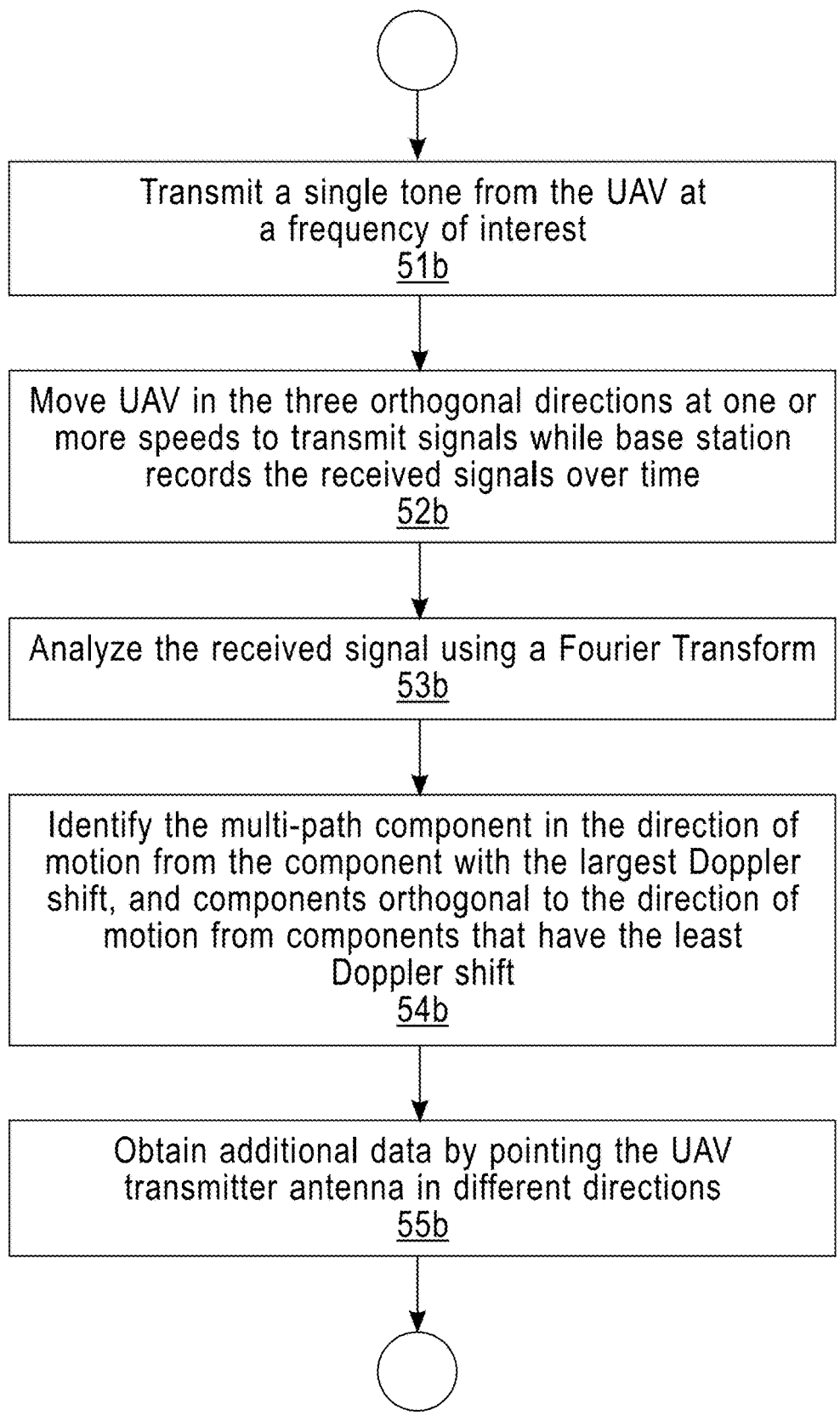

A method of calibrating a MIMO receiver according to an embodiment is illustrated in the flow chart of FIG. 5B. Referring now to the flow chart, a method according to an embodiment begins at step 51b, by having the UAV transmit a single tone at the frequency of interest. The UAV makes short quick movements in the three orthogonal directions and one or more speeds and transmits signals over time, at step 52b, and the received signals are recorded by the base station. At step 53b, the received signal is analyzed using a Fourier Transform for the different frequency components. As in the case of calibrating the MIMO transmitter, the base station uses Fourier analysis to understand the Doppler effect and to estimate the different paths of the signal to estimate the properties of the communication channel for calibration. Thus, at step 54b, the multi-path component in the direction of motion is identified from the component with the largest Doppler shift, while components orthogonal to the direction of motion are identified from components that have the least Doppler shift. Additional data can be obtained at step 55b by pointing the UAV transmitter antenna in different directions using a combination of rotation and multiple switched/phased array antennas, if available. In the case of multiple switched antennas, there can be multiple antennas pointing in different directions, and a switch can choose which antenna to use. In this case, accurate rotation is not necessary. Instead, the UAV can remain steady while the antennas are switched in and out. In some embodiment, electronic switching is expected to be faster than UAV rotation, and offers an advantage.

Embodiments of the disclosure can be applied to microwave and MIMO systems to analyze multi-path components and to create a 3D map of wireless coverage that includes effects such as shadowing, fading and multiple-paths. A method according to an embodiment for analyzing multi-path components in a MIMO system includes optimizing MIMO transmitter outputs to maximize a communications data rate, and then modifying the channel to reduce fading paths for microwave communications.

As will be appreciated by one skilled in the art, embodiments of the present disclosure may be embodied as a system, method or computer program product. Accordingly, embodiments of the present disclosure may take the form of an entirely hardware embodiment, an entirely software embodiment (including firmware, resident software, microcode, etc.) or an embodiment combining software and hardware embodiments that may all generally be referred to herein as a "circuit," "module" or "system." Furthermore, embodiments of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
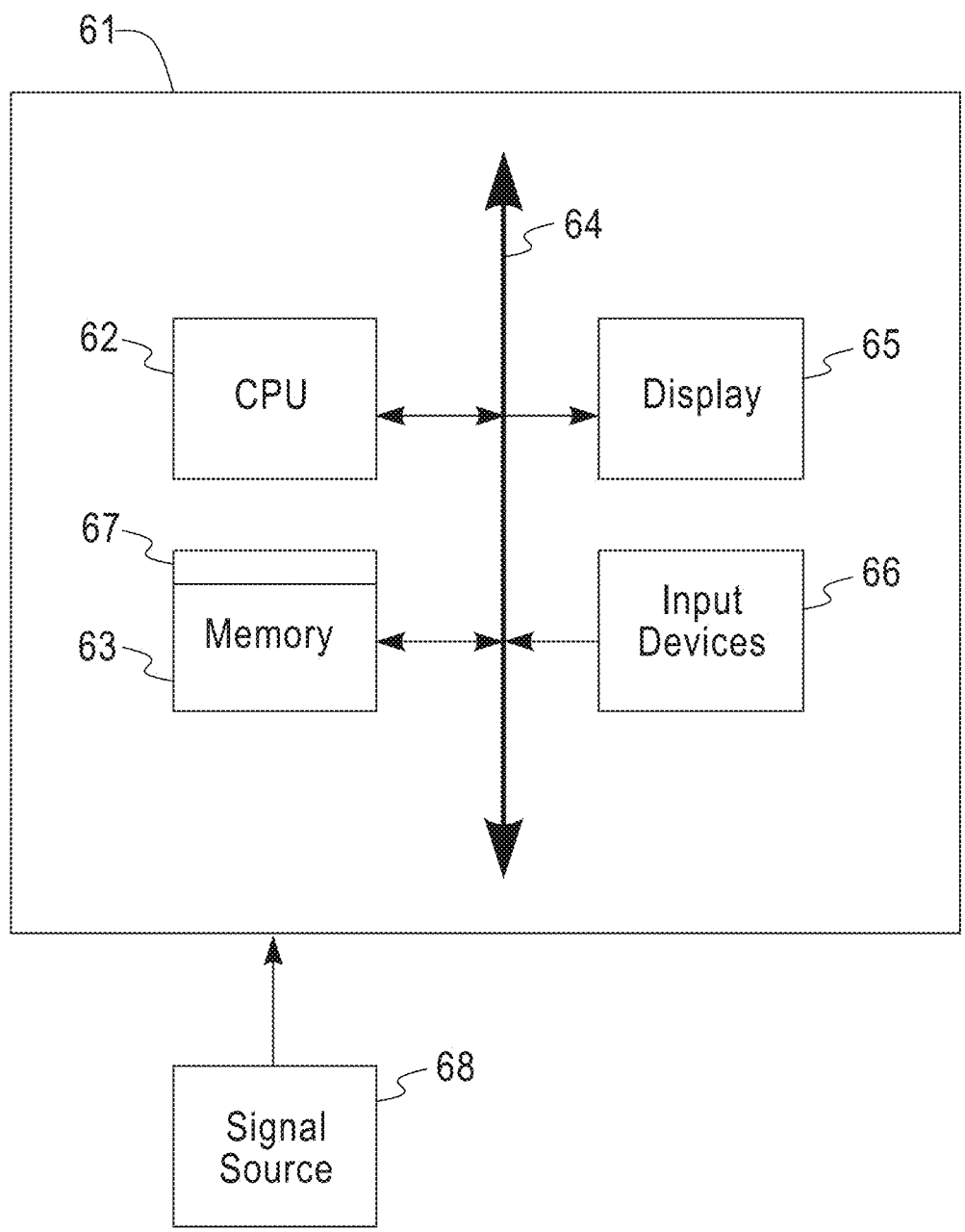
FIG. 6 is a block diagram of an exemplary computer system for implementing a method according to an embodiment of the disclosure.

FIG. 6 is a block diagram of an exemplary computer system for implementing a method according to an embodiment of the disclosure. Referring now to FIG. 6, a computer system 61 for implementing the present disclosure can comprise, inter alia, a central processing unit (CPU) 62, a memory 63 and an input/output (I/O) interface 64. The computer system 61 is generally coupled through the I/O interface 64 to a display 65 and various input devices 66 such as a mouse and a keyboard. The support circuits can include circuits such as cache, power supplies, clock circuits, and a communication bus. The memory 63 can include random access memory (RAM), read only memory (ROM), disk drive, tape drive, etc., or a combinations thereof. The present disclosure can be implemented as a routine 67 that is stored in memory 63 and executed by the CPU 62 to process the signal from the signal source 68. As such, the computer system 61 is a general purpose computer system that becomes a specific purpose computer system when executing the routine 67 of the present disclosure.

The computer system 61 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present disclosure has been described in detail with reference to exemplary embodiments, those skilled in the art will appreciate that various modifications and substitutions can be made thereto without departing from the spirit and scope of the disclosure as set forth in the appended claims.

What is claimed is:

1. An apparatus for calibrating a multi-antenna system, comprising:
    an unmanned aerial vehicle (UAV), comprising
        one or more micro-wave single channel radios that can transmit and receive a micro-wave signal to or from a multi-antenna system under test;
        an antenna;
        a plurality of sensors, and
        a digital microprocessor unit connected to the sensors and one or more radios, said digital microprocessor unit configured to control motion of the UAV and to analyze signals received from or transmitted by the antenna using position information received from the sensors,
    wherein the UAV moves in three orthogonal directions at one or more speeds, and transmits a single tone at a frequency of interest to a MIMO base station,
    wherein the MIMO base station analyzes received signals, including the micro-wave signal, using a Fourier Transform, and identifies Doppler shifts in the analyzed signals, wherein a multi-path component in a direction of motion has a largest Doppler shift, and components orthogonal to the direction of motion have the least Doppler shift,
    wherein the UAV obtains additional data by pointing the antenna in different directions using a combination of rotation and multiple switched/phased array antenna, and uses the additional data to improve resolution of a model of the multi-path components.

2. The apparatus of claim 1, wherein the antenna is one of an omni or a directional antenna.

3. The apparatus of claim 1, wherein the sensors include a gyroscope, an accelerometer, an altimeter, a GPS receiver and a camera.

4. The apparatus of claim 1, wherein the UAV includes multiple antennas with switched beam/phased array functionality at the frequency being analyzed.

5. A method of calibrating a MIMO system using an unmanned aerial vehicle (UAV), comprising the steps of:
    moving the UAV in three orthogonal directions at one or more speeds and transmitting, by the UAV, a single tone at a frequency of interest;
    receiving a signal, including the single tone, and recording the received signal by a MIMO base station over time;
    analyzing the received signal using a Fourier Transform;
    identifying Doppler shifts in the analyzed signals, wherein a multi-path component in a direction of motion has a largest Doppler shift, and components orthogonal to the direction of motion have the least Doppler shift;
    obtaining additional data by pointing a transmitter antenna of the UAV in different directions using a combination of rotation and multiple switched/phased array antenna, and
    using the additional data to improve resolution of a model of the multi-path components.

6. A method of calibrating a MIMO system using an unmanned aerial vehicle (UAV), comprising the steps of:
    moving the UAV in three orthogonal directions at one or more speeds;
    transmitting, by the MIMO system, a single tone at a frequency of interest;
    receiving a signal, including the single tone, and recording the received signal by the UAV over time;
    analyzing the received signal using a Fourier Transform;
    identifying Doppler shifts in the analyzed signals, wherein a multi-path component in a direction of motion has a largest Doppler shift, and components orthogonal to the direction of motion have the least Doppler shift;
    obtaining additional data by pointing a receiver antenna of the UAV in different directions using a combination of rotation and multiple switched/phased array antenna, and
    using the additional data to improve resolution of a model of the multi-path components.

7. An apparatus for calibrating a multi-antenna system, comprising:
    an unmanned aerial vehicle (UAV), comprising
        one or more micro-wave single channel radios that can transmit and receive a micro-wave signal to or from a multi-antenna system under test;
        an antenna;
        a plurality of sensors, and
        a digital microprocessor unit connected to the sensors and one or more radios, said digital microprocessor unit configured to control motion of the UAV and to analyze signals received from or transmitted by the antenna using position information received from the sensors,
    wherein the UAV moves in three orthogonal directions at one or more speeds,
    a MIMO base station transmits a single tone at a frequency of interest,
    the UAV receives a signal, including the single tone, and records the received signal over time,
    analyzes the received signal using a Fourier Transform;
    identifies Doppler shifts in the analyzed signals, wherein a multi-path component in a direction of motion has a largest Doppler shift, and components orthogonal to the direction of motion have the least Doppler shift;
    obtains additional data by pointing a receiver antenna of the UAV in different directions using a combination of rotation and multiple switched/phased array antenna, and
    uses the additional data to improve resolution of a model of the multi-path components.

8. The apparatus of claim 7, wherein the antenna is one of an omni or a directional antenna.

9. The apparatus of claim 7, wherein the sensors include a gyroscope, an accelerometer, an altimeter, a GPS receiver and a camera.

10. The apparatus of claim 7, wherein the UAV includes multiple antennas with switched beam/phased array functionality at the frequency being analyzed.

* * * * *